United States Patent
Boisseau et al.

(10) Patent No.: US 10,511,295 B2
(45) Date of Patent: Dec. 17, 2019

(54) CIRCUIT FOR COMPARISON OF A VOLTAGE WITH A THRESHOLD AND CONVERSION OF ELECTRICAL ENERGY

(71) Applicant: Commissariat A L'Energie Atomique Et Aux Energies Alternatives, Paris (FR)

(72) Inventors: Sébastien Boisseau, Grenoble (FR); Ghislain Despesse, Saint Egreve (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 194 days.

(21) Appl. No.: 14/650,644

(22) PCT Filed: Oct. 3, 2013

(86) PCT No.: PCT/FR2013/052356
§ 371 (c)(1),
(2) Date: Jun. 9, 2015

(87) PCT Pub. No.: WO2014/091096
PCT Pub. Date: Jun. 19, 2014

(65) Prior Publication Data
US 2015/0326212 A1 Nov. 12, 2015

(30) Foreign Application Priority Data
Dec. 11, 2012 (FR) .................. 2012/052880

(51) Int. Cl.
H02M 7/217 (2006.01)
H03K 5/24 (2006.01)
(Continued)

(52) U.S. Cl.
CPC ............ *H03K 5/2472* (2013.01); *H02J 7/022* (2013.01); *H02M 7/2176* (2013.01);
(Continued)

(58) Field of Classification Search
CPC .... H02M 1/32; H02M 2001/007; H02M 7/06; H02M 7/066; H02M 1/4225;
(Continued)

(56) References Cited

U.S. PATENT DOCUMENTS 4,217,505 A * 8/1980 Aoki .................... H03K 3/355
327/176
4,556,961 A * 12/1985 Iwahashi ................ G11C 5/063
365/1
(Continued)

FOREIGN PATENT DOCUMENTS

FR 2873242 1/2006
KR 2008089752 10/2008

OTHER PUBLICATIONS

International Search Report relative to PCT/FR2013/052356, dated Feb. 18, 2014, 3 pages.
(Continued)

*Primary Examiner* — Jue Zhang
*Assistant Examiner* — Lorena D Bruner
(74) *Attorney, Agent, or Firm* — Moreno IP Law LLC (57) ABSTRACT

The instant disclosure relates to a circuit for comparing a voltage with a first threshold, in which said first threshold depends on a second threshold of opening at least one first normally closed breaker.

12 Claims, 3 Drawing Sheets

(51) Int. Cl.
*H03K 5/08* (2006.01)
*H02J 7/02* (2016.01)
*H02N 2/18* (2006.01)
*H02M 1/00* (2006.01)

(52) U.S. Cl.
CPC ............. *H02N 2/181* (2013.01); *H02N 2/186* (2013.01); *H03K 5/08* (2013.01); *H02M 2001/0006* (2013.01); *H02M 2001/0054* (2013.01)

(58) Field of Classification Search
CPC ...... H02M 3/156; H02M 3/158; H02M 7/217; G05F 1/02; H05B 33/0815; Y02B 70/126; G06F 1/02
USPC .......................................................... 363/89
See application file for complete search history.

(56) References Cited

U.S. PATENT DOCUMENTS

| | | | | |
|---|---|---|---|---|
| 5,161,097 | A * | 11/1992 | Ikeda | G05F 1/563 323/222 |
| 5,828,258 | A * | 10/1998 | Ooishi | G11C 11/4076 327/276 |
| 7,106,536 | B2 * | 9/2006 | Fang | H01F 13/006 327/110 |
| 9,112,428 | B2 * | 8/2015 | Bailey | H02M 7/538 |
| 2004/0077150 | A1 * | 4/2004 | Tosaka | H03K 17/693 438/313 |
| 2006/0131960 | A1 * | 6/2006 | Aritsuka | H02J 3/1814 307/17 |
| 2007/0035334 | A1 | 2/2007 | Koike | |
| 2007/0223255 | A1 | 9/2007 | Condemine et al. | |
| 2008/0074908 | A1 | 3/2008 | Chang et al. | |
| 2008/0285361 | A1 * | 11/2008 | Kim | G11C 7/1051 365/189.15 |
| 2010/0270996 | A1 | 10/2010 | Ramadas et al. | |
| 2011/0109347 | A1 | 5/2011 | Rao | |

OTHER PUBLICATIONS

"An Input-Powered Active AC/DC Converter with Zero Standby Power for Energy Harvesting Applications"; Yuan Rao and David P. Arnold; Interdisciplinary Microsystems Group, Dept. of Electrical and Computer Engineering, University of Florida; 2010 Energy Conversion Congress & Exposition; pp. 4441-4446.

"Power Conversion and Integrated Circuit Architecture for High Voitage Piezoelectric Energy Harvesting"; P. Gasnier, J. Willemin, J-J. Chaillout, C. Condemine, G. Despesse, S. Boisseau, G. Gouvernet and C. Barla; 2012 IEEE 10th International New Circuits and Systems Conference; pp. 377-380.

"A Sub-0.3V CMOS Rectifier for Energy Harvesting Applications"; D. Niu, Z. Huang, Na. Jiang, Y. Inoue; Graduate School of Information, Production and Systems, Waseda University; 2011 IEEE 54th International Midwest Symposium on Circuits & and Systems; 4 pgs.

English translation of Written Opinion of the International Searching Authority relative to PCT/FR2013/052356, 7 pages.

* cited by examiner

CIRCUIT FOR COMPARISON OF A VOLTAGE WITH A THRESHOLD AND CONVERSION OF ELECTRICAL ENERGY

BACKGROUND

The present disclosure generally relates to the conversion of electrical energy, and more specifically aims at the conversion of electrical energy in ambient energy harvesting generators or power supplies. The present disclosure also aims at a circuit for comparing a voltage with a threshold.

DISCUSSION OF THE RELATED ART

To power electronic systems having a low power consumption, it has been provided to use generators capable of converting energy available in the system environment, for example, mechanical energy, into electrical energy. Generators where ambient mechanical energy is converted into electrical energy by a piezoelectric element are in particular known. To transform the electrical energy supplied by the piezoelectric element into electrical energy capable of being used by an electronic system, such generators comprise an electrical energy conversion device placed downstream of the piezoelectric element. The electrical energy conversion device may comprise a circuit for comparing a voltage with a threshold.

Examples of electrical energy conversion devices are described, in particular, in French patent application published under number 2873242, previously filed by the applicant, and in article "Power Conversion and Integrated Circuit Architecture for High Voltage Piezoelectric Energy Harvesting" by Pierre Gasnier et al., describing prior works conducted by the applicant.

SUMMARY

An embodiment provides a circuit for comparing a voltage with a threshold, comprising: a first inverter having first and second power supply nodes respectively coupled to first and second nodes of application of said voltage; and a first normally-on switch connecting an input of the first inverter to the first node of application of the voltage, a control gate of the first switch being connected to the second node of application of the voltage.

According to an embodiment, the first power supply node of the first inverter is connected to the first node of application of the voltage via a voltage limiter.

According to an embodiment, the voltage limiter comprises a second normally-on switch between the first node of application of the voltage and the first power supply node of the first inverter.

According to an embodiment, the voltage limiter further comprises at least one third normally-on switch cascaded with the second switch.

According to an embodiment, the voltage limiter comprises a diode having its anode on the side of the first node of application of the voltage and having its cathode on the side of the first power supply node of the first inverter.

According to an embodiment, the comparison circuit comprises a second inverter in series with the first inverter.

According to an embodiment, an output node of the comparison circuit is connected to an output of the second inverter.

According to an embodiment, the first switch is a depletion MOS transistor.

According to an embodiment, the input of the first inverter is connected to an output of the comparison circuit via a first resistor.

According to an embodiment, the input of the first inverter is connected to the second node of application of the voltage via a second resistor.

According to an embodiment, the input of the first inverter is connected to the first switch via a third resistor.

Another embodiment provides an energy conversion circuit, comprising: a first element comprising an electrical energy converter; and a voltage comparison circuit of the above-mentioned type.

According to an embodiment, the energy conversion circuit further comprises a second electrical energy storage element, capable of being powered by the first element.

According to an embodiment, the energy conversion circuit further comprises a normally-on bypass switch placed between an input node and an output node of the first element.

According to an embodiment, the comparison circuit is configured to compare the voltage across the second element with the threshold.

According to an embodiment, the comparison circuit is configured to control the bypass switch according to the voltage across the second element.

According to an embodiment, the comparison circuit is configured to control a normally-off switch connected to a power supply node of a circuit for controlling the electrical energy converter.

According to an embodiment, the second element is configured to power a circuit for controlling the electrical energy converter, and a third electrical energy storage element is configured to power an external load.

BRIEF DESCRIPTION OF THE DRAWINGS

The foregoing and other features and advantages will be discussed in detail in the following non-limiting description of specific embodiments in connection with the accompanying drawings, among which.

For clarity, the same elements have been designated with the same reference numerals in the different drawings.

DETAILED DESCRIPTION

Ambient energy (for example, mechanical energy) harvesting generators may be used in various fields, for example, transport, to power pressure, temperature, vibration sensors, etc., placed on a vehicle; industry, to power machine monitoring sensors; housing, to power wireless switches, pressure sensors, stress sensors, etc.; the medical field, to power assistance or monitoring equipment implanted in a patient's body; environment, to power sensors for monitoring meteorological or other phenomena; defense and space, to power appliance or border monitoring sensors; and consumer electronics, to totally or partially power portable devices such as phones, MP3 players, remote controls, etc. The use of ambient energy harvesting generators especially enables to form totally self-contained wireless sensors, which are thus easy to install and do not require repeated and expensive battery replacement operations. The use of ambient energy harvesting generators also enables to extend the lifetime of the batteries of certain sensors.

In a mechanical energy harvesting generator, the harvested energy may originate from various sources, for example, vibrations, shocks, deformations, from a force exerted by a user, etc. The mechanoelectrical conversion element may be of piezoelectric type, or of another type, for example, of electrostatic, electromagnetic, magnetostrictive type, etc.

Most of the time, the electrical energy supplied by the mechanoelectrical conversion element cannot be directly used to power an electronic system. Indeed, usual electronic systems are powered with D.C. voltages of a few volts, for example, in the range from 2 to 12 volts, while the mechanoelectrical conversion element generally delivers an A.C. or transient voltage of strong amplitude, for example, greater than 30 volts, and a very low current, for example, in the range from 10 nanoamperes to 100 microamperes, or less.

To transform the electrical energy supplied by the mechanoelectrical conversion element into energy exploitable by an electronic system, a mechanical energy harvesting generator may comprise an electrical energy conversion device, for example comprising a voltage or current converter, or a current-to-voltage converter.

The electrical energy conversion device may comprise a rectifying element, for example, a diode bridge, receiving the energy delivered by the mechanoelectrical conversion element and, at the output of the rectifying element, a capacitive storage element, for example, a capacitor, an accumulator, or a battery, delivering a D.C. voltage having a level adapted to the power supply of an electronic system. A problem is that the efficiency of such a conversion device is relatively low, particularly when there exists a significant voltage level difference between the input and the output of the rectifying element.

To increase the conversion efficiency, an electrical energy conversion device comprising an active electrical energy converter, for example, a switched-mode converter, the mechanoelectrical element, and the storage element, may be provided. In operation, the switched-mode converter receives an amplitude signal (possibly rectified) depending on the quantity of mechanical energy received and on the characteristics of the mechanoelectrical conversion element, and delivers across the storage element a D.C. signal having a level adapted to powering an electronic system. Losses due to the signal level difference between the output of the conversion element and the storage element are thus decreased. A problem is due to the fact that a switched-mode converter requires being powered to be able to operate. In steady state, the electrical energy for supplying the switched-more converter may be sampled from the output storage element of the voltage converter. However, during a generator starting phase, if the storage element is discharged, a booster power supply is necessary. It may further be necessary to provide a circuit for comparing a voltage with a threshold to detect the end of the starting phase. A problem is that known voltage comparison circuits have a relatively significant electrical power consumption. Further, at the end of the starting phase, the switching between the booster power supply and the power supply by the storage element may raise difficulties.

It would be desirable to be able to solve all or part of the problems of known electrical energy conversion devices.

It would further be desirable to be able to have a circuit for comparing a voltage with a threshold, which overcomes all or part of the problems of known comparison circuits.

Figure 1:
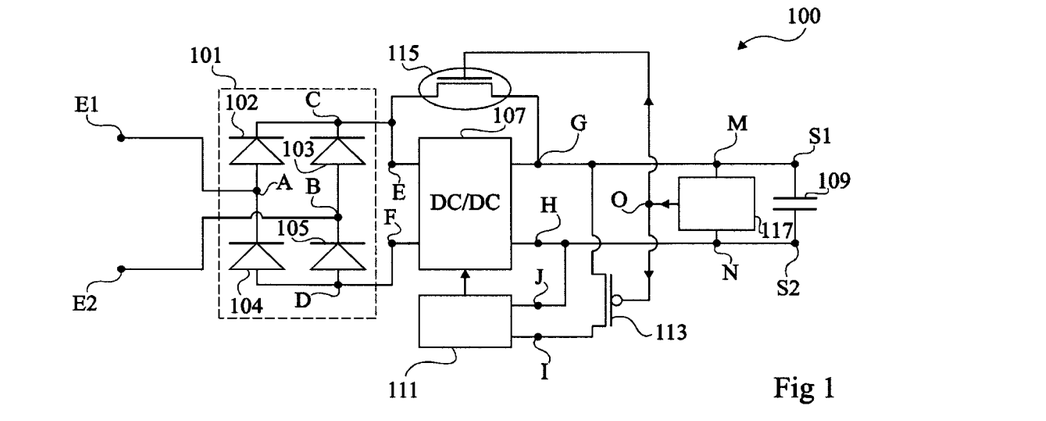
FIG. 1 schematically shows an embodiment of an electrical energy conversion device.

FIG. 1 schematically shows an example of an embodiment of an electrical energy conversion device 100, capable of converting an A.C. or transient electrical energy, for example, supplied by a mechanoelectrical conversion element (not shown) or any other fluctuating or intermittent energy source, into a D.C. voltage, for example, compatible with the powering of an electronic circuit (not shown).

Device 100 comprises a rectifying element 101 comprising input nodes A and B, respectively connected or coupled to input nodes E1 and E2 of device 100 (capable of being connected to output nodes of an energy harvesting device), and output nodes C and D. In the shown example, rectifying element 101 comprises a diode 102 between nodes A and C, a diode 103 between nodes B and C, a diode 104 between nodes D and A, and a diode 105 between nodes D and B, the anodes of diodes 102, 103, 104, and 105 being respectively on the side of node A, on the side of node B, on the side of node D, and on the side of node D. Device 100 further comprises a switched-mode converter 107 of D.C./D.C. type, comprising input nodes E and F, respectively connected to output nodes C and D of rectifying element 101, and output nodes G and H, respectively connected to output nodes S1 and S2 of device 100. Device 100 further comprises a storage element 109, for example, a capacitor, an accumulator, or an electric battery, between nodes S1 and S2. Element 109 may also have a filtering function. Device 100 further comprises an electronic circuit 111 for controlling transistors (not shown in FIG. 1) of switched-mode converter 107. Circuit 111 comprises high and low power supply nodes I and J respectively connected to nodes S1 and S2. In the shown example, node J is directly connected to node S2, and node I is connected to node S1 via a normally-off switch 113, for example, a P-channel MOS transistor.

According to an aspect, device 100 comprises a normally-on bypass switch 115 between an output node of rectifying element 101 and an output node of switched-mode converter 107. Switch 115 may be a normally-on transistor or depletion transistor, that is, a transistor where a channel exists when no voltage is applied to its control node (for example, when the gate-source voltage is zero in the case of a MOS transistor). Switch 115 for example is a DMOS transistor, also called depletion MOS transistor. In the example of FIG. 1, conduction nodes of switch 115 are directly respectively connected to output node C of rectifying element 101 and to output node G of switched-mode converter 107. As a variation, a diode (not shown) may be series-connected with switch 115, between nodes C and G, for example, upstream of switch 115, to only allow the flowing of current through switch 115 from node C to node G.

Device 100 further comprises a circuit 117 for comparing a voltage with a threshold, capable of controlling switches 115 and 113 according to the voltage across storage element 109. In the shown example, circuit 117 comprises input nodes of high potential M and of low potential N respectively connected to output nodes S1 and S2 of device 100, and an output node O connected to the control gates of switches 115 and 113.

The operation of the electrical energy conversion device of FIG. 1 will now be described.

At the beginning of a starting phase, for example, when device 100 has not been used for a long period, storage element 109 is discharged, that is, the voltage between output nodes S1 and S2 is substantially zero. Since circuit 117 is not powered, no control signal is applied to switches 115 and 113. Switch 115, which is normally on, is thus in the conductive state, and switch 113, which is normally off, is in the non-conductive state. Further, since circuit 111 for controlling switched-mode converter 107 is not powered, switched-mode converter 107 is inactive.

When an A.C. or transient electrical signal, for example, output by a mechanoelectrical conversion element of a mechanical energy harvesting generator, is received on input nodes E1 and E2 of device 100, this signal is rectified by element 101, which requires no specific power supply (other than the input signal that it receives) to operate. Switch 115 being in the on state, it forms a conductive path for bypassing switched-mode converter 107, and the rectified electrical signal output by element 101 is transferred onto output nodes S1 and S2 of device 100. This signal charges storage element 109.

When the charge level of storage element 109 exceeds a threshold, this is detected by circuit 117, which makes switch 115 turn off and switch 113 turn on. In this example, switch 115 is an N-channel depletion transistor (DMOS), and switch 113 is a P-channel enrichment transistor (MOS). The application, by circuit 117, of a same low level control signal on the gates of transistors 115 and 113 thus enables to simultaneously control the turning-off of transistor 115 and the turning-on of transistor 113.

The turning-on of switch 113 causes the powering-on of control circuit 111 of switched-mode converter 107, and thus the activation of converter 107. The electrical energy necessary to control the transistors of switched-mode converter 107 is drawn from storage element 109 by circuit 111. The turning-off of switch 115 interrupts the conductive path for bypassing switched mode converter 107. The electric output signal of rectifying element 101 is thus no longer directly transferred across storage element 109, but is transformed by switched-mode converter 107 and the output signal of converter 107 charges storage element 109.

An advantage of the embodiment of FIG. 1 is that device 100 can start autonomously, even when storage element 109 is fully discharged (for example, after a long period without being used). Device 100 thus requires no booster power supply.

Another advantage is that, in steady state, that is, after a starting phase during which storage element 109 is charged to a level sufficient to power switched-mode converter 107, device 100 has a high conversion efficiency as compared with a device comprising no active electrical energy converter (that is, receiving a specific electrical supply energy, other than the input signal to be converted).

As a variation, switches 113 and 115 may, instead of being simultaneously controlled by a same signal, as in the example of FIG. 1, be controlled via different signals. As an example, a control unit, not shown, for example, a microcontroller, may be provided between output O of circuit 117 and the control gates of switches 113 and 115 to control switch 113 independently from transistor 115. Switch 113 may for example be made to turn on slightly before the turning-on of switch 115 to guarantee that switched-mode converter 107 is operational as soon as switch 115 has been turned off. In another alternative embodiment, switch 113 may be suppressed, that is, node I may be directly connected to node S1.

Figure 2:
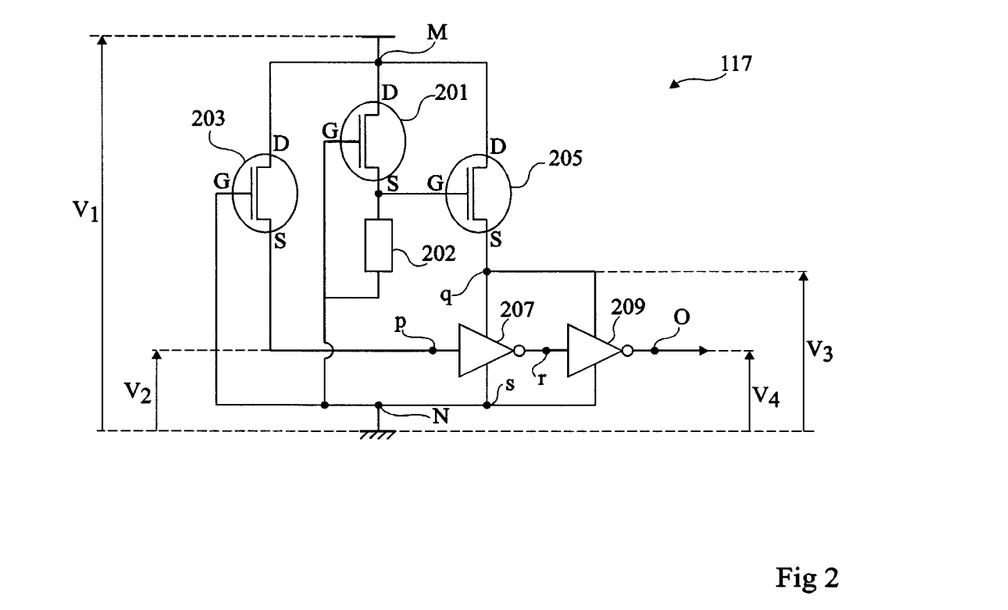
FIG. 2 shows an embodiment of a circuit for comparing a voltage with a threshold.

FIG. 2 shows in further detail an embodiment of circuit 117 for detecting the threshold voltage of the device of FIG. 1, or circuit for comparing a voltage with a threshold. In this example, circuit 117 comprises three depletion MOS transistors (DMOS) 201, 203, and 205, and two CMOS inverters (or NMOS-PMOS pairs) 207 and 209. The drains (D) of transistors 201, 203, and 205 are connected to high-potential input node M of circuit 117. The source (S) of transistor 201 is connected to low-potential input node N or ground node of circuit 117 via a resistor 202, the source (S) of transistor 203 is connected to input node p of inverter 207, and the source (S) of transistor 205 is connected to a high power supply node q of inverters 207 and 209. Inverters 207 and 209 are series-connected, that is, output r of inverter 207 is connected to the input of inverter 209. The output of inverter 209 is connected to output node O of circuit 117. Node N is connected to a low power supply node s of inverters 207 and 209. The gate of transistor 205 is connected to the source of transistor 201. The gates of transistors 201 and 203 are connected to node N.

The operation of circuit 117 of FIG. 2 will now be described in relation with FIGS. 1, 2, and 3.

Figure 3:
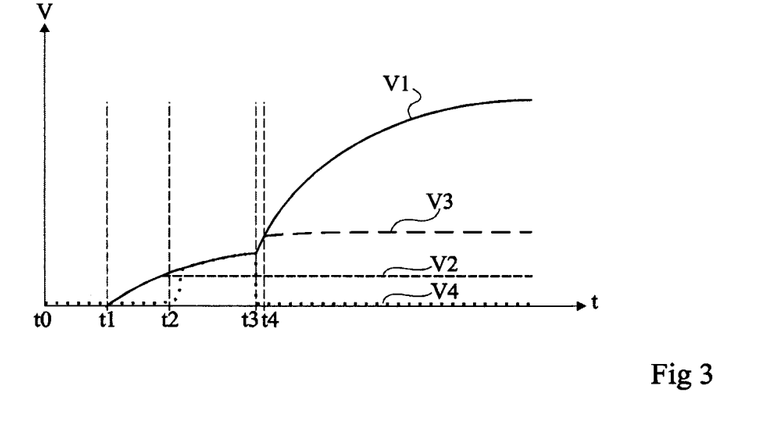
FIG. 3 is a simplified timing diagram illustrating the operation of the comparison circuit of FIG. 2.

FIG. 3 is a timing diagram illustrating the time variation, during a starting phase of device 100 of FIG. 1, of voltages $V_1$ between nodes M and N of circuit 117, $V_2$ between nodes p and N of circuit 117, $V_3$ between nodes q and N of circuit 117, and $V_4$ between nodes O and N of circuit 117.

In the example of FIG. 2, DMOS transistors 201, 203, and 205 are N-channel transistors, that is, normally-on transistors which turn off when a source-gate voltage greater than a positive starting or turn-off threshold is applied. References $V_{TH201}$, $V_{TH203}$, and $V_{TH205}$ will be used hereafter to designate the respective turn-off thresholds of transistors 201, 203, and 205.

At a time t0 of beginning of a starting phase, voltage $V_1$ between input nodes M and N of circuit 117 is substantially zero (storage element 109 discharged). Voltages $V_2$, $V_3$, and $V_4$ are also substantially zero.

At a time t1, when storage element 109 (FIG. 1) starts charging, voltage $V_1$ increases. Transistors 203 and 205 being in the on state, voltages $V_2$ and $V_3$ follow the same variation as voltage $V_1$. Output voltage $V_4$ of circuit 117 also increases.

At a time t2, when voltage $V_2$ comes closer to turn-off threshold $V_{TH203}$ of transistor 203, transistor 203 tends to turn off. Transistor 203 then behaves as a voltage limiter and voltage $V_2$ substantially settles at value $V_{TH203}$. Voltage $V_1$ keeps on increasing along with the charge of capacitor 109, and voltages $V_3$ and $V_4$ follow the same variation as voltage $V_1$.

At a time t3, when power supply voltage $V_3$ of inverters 207 and 209 exceeds a threshold equal to approximately twice saturation level $V_{TH203}$ of input voltage V2 of the inverters, output r of inverter 207 switches from a low state to a high state. The output of inverter 209 then switches from a high state (voltage $V_4$ substantially equal to power supply voltage $V_3$ of the inverters) to a low state (voltage $V_4$ substantially zero), that is, output node O of circuit 117 is substantially taken to the potential of ground node N. Such a switching marks the end of the starting phase. In the electrical energy conversion device of FIG. 1, it causes the turning-off of switch 115 and the turning-on of switch 113, and thus the activation of switched-mode converter 107.

At a time t4 little after time t3, voltage $V_3$ settles at a value substantially equal to $V_{TH201}+V_{TH205}$, and this, even if voltage $V_1$ starts increasing beyond this value. This enables to limit the power consumption of inverters 207 and 209.

After time t4, output voltage $V_4$ remains in the low state as long as input voltage $V_1$ remains higher than the switching threshold of circuit 117, that is, approximately twice saturation level $V_{TH203}$ of input voltage $V_2$ of the inverters in this example. If voltage $V_1$ falls below this threshold, output voltage $V_4$ of circuit 117 switches back to a high state.

An advantage of circuit 117 of FIG. 2 is that, when voltage $V_1$ reaches the switching threshold of circuit 117, the state switching of output O of circuit 117 is particularly fast. When circuit 117 is used in electrical energy conversion device 100 of FIG. 1, this particularly enables to avoid an unwanted locking of device 100 in a configuration where switches 113 and 115 would be both partially on.

Another advantage is that, after the starting phase, when device 100 operates in steady state, inverters 207 and 209 do not switch, and DMOS transistors 201, 203, and 205 are in an almost totally off state, each DMOS transistor having its gate-source voltage substantially equal to the turn-off threshold of the transistor. As a result, the power consumption of circuit 117 in steady state is very low, for example, lower than 50 nano-amperes.

Another advantage of circuit 117 is that it does not require, to operate, receiving a specific electrical power supply other than the voltage to be monitored between its inputs nodes M and N.

Inverters 207 and 209 of circuit 117 for example are so-called simple inverters, that is, each comprising first and second complementary transistors in series between high and low power supply nodes of the inverter, the gates of the two transistors being interconnected. As a variation, inverters 207 and 209 may be so-called encapsulated inverters, that is, each comprising, in addition to the first and second transistors of a simple inverter, third and fourth transistors respectively between the high power supply node and the source of the first transistor, and between the low power supply node and the source of the second transistor, the gates of the third and fourth transistors being connected to the gates of the first and second transistors. As a variation, inverters 207 and 209 may be so-called encapsulated delayed inverters, that is, each comprising, in addition to the four transistors of an encapsulated inverter, a RC delay circuit between the gates of the first and second transistors, and the gates of the third and fourth transistors. The use of inverters of encapsulated or encapsulated-delayed type especially enables to limit the power consumption of circuit 117, while avoiding for a conduction path to be created between the high and low power supply nodes of the inverter on switching of circuit 117.

The inventors have observed that circuit 117 of FIG. 2 has a good performance when using, for DMOS transistor 201, a component bearing reference BF992 having a 1.4-volt turn-off threshold, for DMOS transistors 203 and 205, components bearing reference BF994 having a 1-volt turn-off threshold, for inverters 207 and 209, assemblies of encapsulated type using components bearing reference MC14007, and for resistor 202, a 500-MΩ resistor. The described embodiments are of course not limited to this specific case.

Various variations of circuit 117 of FIG. 2 may be provided, where such variations may possibly be combined.

As a first variation, a capacitance may be added between ground node N of circuit 117 and each of the inputs and/or outputs of inverters 207 and 209, to stabilize the input and/or output states of the inverters.

As a second variation, a resistor may be added between ground node N of circuit 117 and each of the inputs and/or outputs of inverters 207 and 209, to ease the switching of the inverters or their returning to the initial state in case of a decrease in voltage $V_1$.

In the example of FIG. 2, transistor 203 plays the role of a limiter of input voltage $V_2$ of inverter 207, and the cascade of transistors 201 and 205 plays the role of a limiter of power supply voltage $V_3$ of inverters 207 and 209. As a third variation, it may be provided to form each of these voltage limiters with a number of cascaded DMOS transistors different from the example of FIG. 2, which particularly enables to adjust the switching threshold of circuit 117. For example, in the example of FIG. 2, transistors 201, 205 and resistor 202 may be replaced with a single DMOS transistor (having its drain, its source, and its gate respectively connected to nodes M, q, and N) having a turn-off threshold equal to $V_{TH201}+V_{TH205}$, or by a voltage limiter comprising a number of cascaded DMOS transistors greater than 2, and transistor 203 may be replaced with a plurality of cascaded DMOS transistors.

As a fourth variation, the limiter of voltage $V_3$, formed in the example of FIG. 2 by the cascade of transistors 201 and 205 and by resistor 202, may be replaced with a simplified voltage limiter, comprising a first diode (not shown) having its anode connected to node M and having its cathode connected to node q. In this fourth variation, a second diode (not shown) may further be provided between node M and the drain (D) of transistor 203. It should be noted that each of the first and second diodes may be replaced with an association of a plurality of diodes in series, according to the voltage drop which is desired to be obtained between node M and node q on the one hand, and between node M and the drain of transistor 203 on the other hand.

It should further be noted that the limiter of voltage $V_3$, formed in the example of FIG. 2 by the cascade of transistors 201 and 205 and by resistor 202, is optional. As a fifth variation, this voltage limiter may be suppressed, and node M may for example be directly connected to node q.

As a sixth variation, DMOS transistors 201, 203, and 205 of circuit 117 may be replaced with other types of normally-on switches having a similar operation, that is, tending to turn off when a control voltage exceeding a threshold is applied thereto, for example, JFET transistors.

As a seventh variation, circuit 117 may comprise a number of CMOS inverters in series greater than 2. This particularly enables to increase the circuit switching speed. As a variation, circuit 117 may comprise a single inverter (that is, inverter 209 may be suppressed, and output r of inverter 207 may be directly connected to output O of circuit 117).

Figure 4:
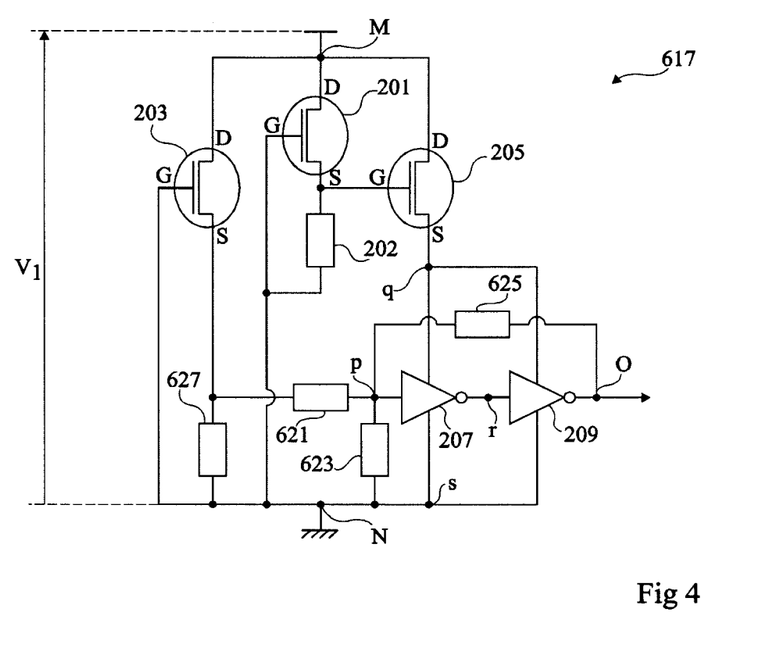
FIG. 4 shows an alternative embodiment of a circuit for comparing a voltage with a threshold.

FIG. 4 shows another embodiment of a circuit 617 for comparing a voltage with a threshold. As an example, circuit 617 may be used to replace circuit 117 for comparing a voltage with a threshold in the electrical energy conversion circuit previously described in relation with FIG. 1, or in electrical energy conversion circuits of the type described hereafter in relation with FIGS. 5 and 6.

In the example of FIG. 4, circuit 617 comprises the same elements as circuit 117 of FIG. 2, substantially arranged in the same way, and further comprises additional resistors. In the following, only the differences between circuits 617 and 117 will be detailed. In the shown example, circuit 617 comprises a resistor 621 between input node p of inverter 207 and the source node (S) of transistor 203 (instead of a direct connection in circuit 117 of FIG. 2), a resistor 623 between node p and node N, and a resistor 625 between input node p of inverter 207 and output node O of the comparison circuit. A resistor 627 may optionally be provided between the source node (S) of transistor 203 and node N. Resistors 621, 623, and 625 give circuit 617 hysteresis properties. Circuit 617 behaves as a comparison circuit of Schmitt trigger type with two switching thresholds, a high threshold VH and a low threshold VB (with VB<VH). In other words, in operation, output O of circuit 617 switches to the low state when voltage $V_1$ between nodes M and N exceeds threshold VH, but only switches back to the high state when voltage $V_1$ falls below threshold VB.

Figure 5:
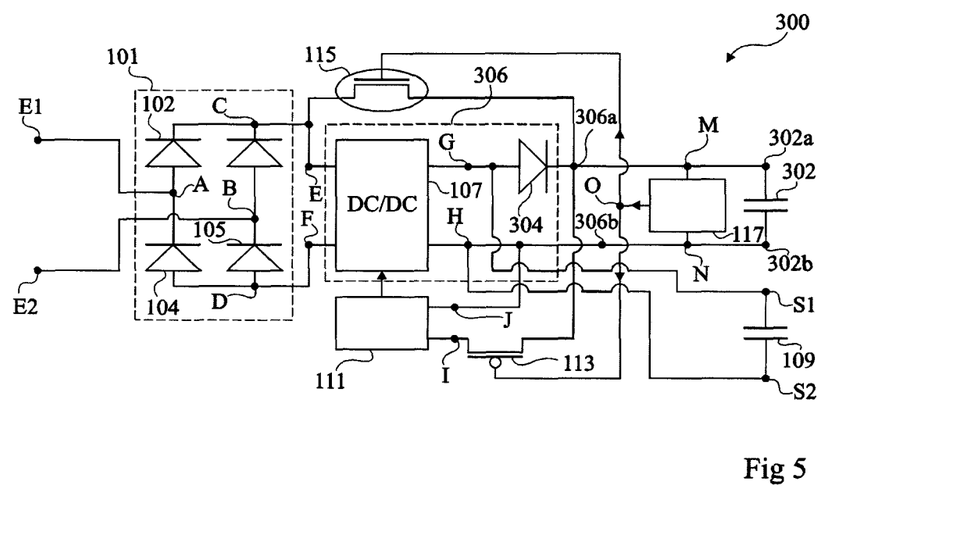
FIG. 5 schematically shows an alternative embodiment of the electrical energy conversion device of FIG. 1.
Figure 6:
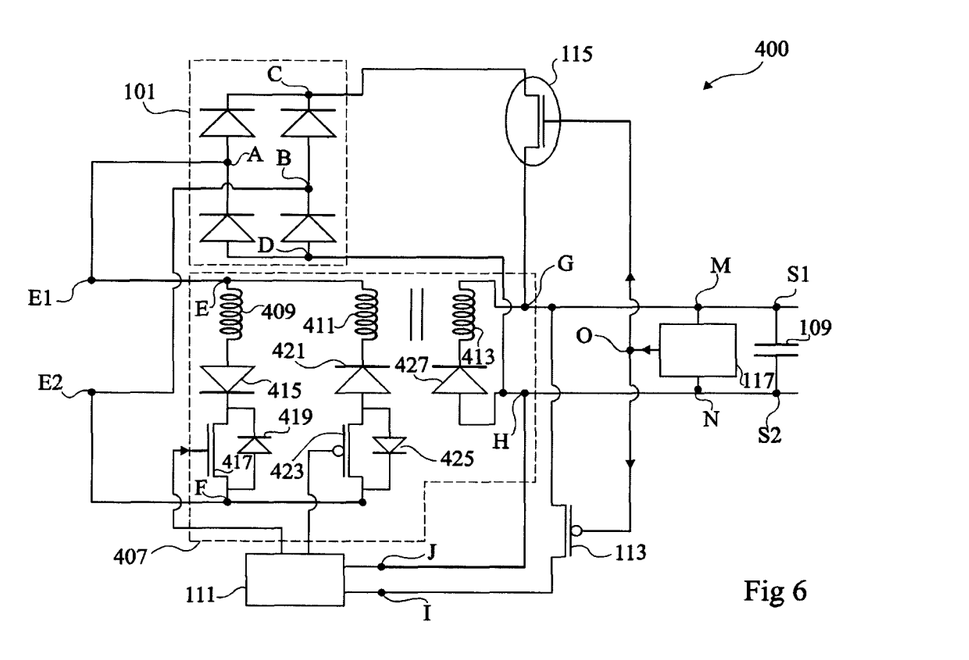
FIG. 6 schematically shows another embodiment of an electrical energy conversion device.

Circuit 617 is particularly advantageous in electrical energy conversion circuits of the type previously described in relation with FIG. 1, or of the type described hereafter in relation with FIGS. 5 and 6. Indeed, in such circuits, the switching of the voltage comparison circuit causes the activation of a switched-mode converter, and may cause a temporary decrease of voltage $V_1$ monitored by the comparison circuit. In the absence of hysteresis, such a voltage decrease may cause a new switching of the comparison circuit, causing the almost immediate deactivation of the switched-mode converter. Such a monitored voltage decrease phenomenon on switching of the comparison circuit can especially be observed in electrical energy conversion circuits with two storage elements, of the type described hereafter in relation with FIG. 5.

It should be noted that circuit 617 of FIG. 4 is compatible with the various above-mentioned alternative embodiments of circuit 117 of FIG. 2. In a preferred embodiment, a circuit for comparing a voltage with a threshold of the type shown in FIG. 4, but where the voltage limiter formed by transistors 201 and 205 and by resistor 202 is replaced with a first diode having its anode connected to node M and having its cathode connected to node q, and wherein a second diode is forward-connected between node M and drain (D) of transistor 203, is provided.

FIG. 5 schematically shows an alternative embodiment of the electrical energy conversion device of FIG. 1. Conversion device 300 of FIG. 5 comprises the same elements as device 100 of FIG. 1, and further comprises, in addition to storage element 109 connected between nodes S1 and S2, a second capacitive storage element 302, for example, a capacitor, having a first electrode 302a connected to node G via a diode 304, the anode of diode 304 being on the side of node G, and having a second electrode 302b connected to node H. In device 300, switched-mode converter 107 and diode 304 are components of an element 306 having outputs nodes 306a and 306b respectively connected to electrodes 302a and 302b of storage element 302. Device 300 further differs from device 100 of FIG. 1 in that high power supply nodes M and I of circuits 111 and 117, instead of being connected to node S1, as in the example of FIG. 1, are connected to output node 306a of element 306, on the cathode side of diode 304 (via switch 113 for node I). Further, switch 115, instead of directly connecting output C of rectifying element 101 to output node G of switched-mode converter 107 as in converter 100, connects it to node 306a.

During a starting phase, as long as switched-mode converter 107 is inactive, only storage element 302 charges. When element 302 reaches a charge level sufficient to power switched-mode converter 107, circuit 117 turns off switch 115 and turns on switch 113, which causes the activation of switched-mode converter 107. In steady state, storage elements 302 and 109 are both charged by the electrical output signal of switched-mode converter 107. In other words, the alternative embodiment of FIG. 5 separates the storage element used for the power supply of switched-mode converter 107 (element 302) from that used to power an external electronic system (element 109). A storage element 109 of greater capacitance than storage element 302 (for example, in the order of 1 µF for element 302 and in the range from 10 µF to 1 mF for element 109) may for example be provided. An advantage is that this enables to start the switched-mode converter faster, the charge speed of element 302 being greater than that of element 109.

As a variation, a number of storage elements greater than two may be provided, for example, to supply voltages of different levels in order to simultaneously power a plurality of different electronic systems.

It should be noted that to form an electrical energy conversion device with two storage elements or more, other assemblies than that of FIG. 5 may be provided. As an example, the switched-mode converter may comprise a transformer comprising, at the primary, a winding, and at the secondary, as many windings as there are storage elements in the conversion device, each winding of the secondary being electromagnetically coupled to the primary winding, and each winding being connected to one of the storage elements of the conversion device. Each storage element is thus mainly charged with the energy received by the secondary winding of the transformer which is associated thereto. As a variation, the switched-mode converter may comprise a transformer comprising, at the primary, a winding, and at the secondary, a single winding electromagnetically coupled to the primary winding, the energy received by the secondary winding being distributed between the various storage elements, for example, by means of switchings using MOS transistors and/or diodes.

FIG. 6 schematically shows an example of another embodiment of an electrical energy conversion device 400, capable of turning an A.C. or transient electrical signal (fluctuating signal), for example, supplied by a mechano-electrical conversion element (not shown), into a D.C. signal, for example, compatible with the power supply of an electronic system (not shown).

Device 400 comprises a rectifying element 101, for example, a diode bridge, comprising input nodes A and B, respectively connected to input nodes E1 and E2 of the device, and output nodes C and D. Device 400 further comprises a switched-mode converter 407 comprising input nodes E and F, respectively connected to input nodes E1 and E2 of device 400, and output nodes G and H, respectively connected to output nodes S1 and S2 of device 400. Output node D of rectifying element 101 is directly connected to output node H of switched-mode converter 407, and output node C of rectifying element 101 is connected to output node G of switched-mode converter 407 via a normally-on switch 115. In other words, in the embodiment of FIG. 6, the switched-mode converter is placed in parallel with rectifying element 101, between the input and the output of device 400, rather than in series with the rectifying element as in the embodiments of FIGS. 1 and 3. Device 400 further comprises a storage element 109, for example, a capacitor, between nodes S1 and S2. Device 400 further comprises an electronic circuit 111 for controlling transistors of switched-mode converter 407. Circuit 111 comprises high and low power supply nodes I and J respectively connected to nodes S1 and S2. In the shown example, node J is directly connected to node S2, and node I is connected to node S1 via a normally-off switch 113. Device 400 further comprises a circuit 117 for comparing a voltage with a threshold, to control switches 115 and 113 according to the charge level of element 109. In the shown example, circuit 117 comprises input nodes of high potential M and of low potential N respectively connected to output nodes S1 and S2, and an output node O connected to the control gates of switches 115 and 113.

According to an aspect of the embodiment of FIG. 6, switched-mode converter 407 itself comprises a rectifier, so that, in steady state, when the switched-mode converter is active, rectifying element 101 no longer needs being used, and may be deactivated by the turning-off of switch 115.

In the example of FIG. 6, switched-mode converter 407 comprises a transformer comprising, at the primary, two windings 409 and 411 and, at the secondary, a winding 413 electromagnetically coupled to both winding 409 and winding 411. On the primary side, switched-mode converter 407 comprises a first branch comprising, in series between nodes E and F, winding 409, a diode 415 having its anode on the side of winding 409, and a switched-mode transistor 417, for example, an N-channel MOS transistor. The first branch further comprises, in antiparallel with transistor 417 and in anti-series with diode 415, a free wheel diode 419 which may be the parasitic source/drain diode of transistor 417. Switched-mode converter 407 further comprises, on the primary side, a second branch, parallel to the first branch, comprising, in series between nodes E and F, winding 411, a diode 421 having its cathode on the side of winding 411, and a switched-mode transistor 423, for example, P-channel MOS transistor. The second branch further comprises, in antiparallel with transistor 423 and in anti-series with diode 421, a free-wheel diode 425 which may be the parasitic source/drain diode of transistor 423. On the secondary side, switched-mode converter 407 comprises, in series between nodes G and H, winding 413 and a diode 427 having its anode on the side of node H.

Specific embodiments have been described. Various alterations, modifications, and improvements will readily occur to those skilled in the art.

In particular, the embodiments described in the present disclosure are not limited to the specific example of starting circuit described in relation with FIG. 2. It will be within the abilities of those skilled in the art to form electrical energy conversion devices of the type described in the present disclosure, by replacing circuit 117 with another starting circuit capable of implementing the desired operation, for example, a circuit comprising an internal reference comparator having an output connected to the gates of switches 113 and 115, the comparator being configured to switch from a high state to a low state when the voltage across a storage element of the device exceeds a threshold.

Further, the electrical energy conversion devices described in the present disclosure may be used in systems other than mechanical energy harvesting generators, for example, thermoelectric generators, photovoltaic generators, transponders or radiofrequency devices, etc. More generally, the described electrical energy conversion devices may be used in any system requiring the transformation of an electrical input signal into an electrical signal of different level. The described conversion devices are particularly advantageous when there is a significant voltage level difference between the input and the output of the device, and/or when the electrical energy source at the input of the device is intermittent or fluctuating.

It should further be noted that the rectifying element provided in the conversion devices of FIGS. 1, 4, and 5 is optional. Further, the forming of switched-mode converters 107 of the conversion devices of FIGS. 1 and 4 has not been detailed in the present application. It should be noted that the embodiments of FIGS. 1 and 4 are compatible with all usual switched-mode converters, and more generally with all active electrical energy converters, that is, comprising at least one transistor, and requiring a specific electrical power supply for the operation thereof. Further, the embodiment of FIG. 6 is not limited to the specific described example of switched-mode converter 407. More generally, the embodiment of FIG. 6 is compatible with any active converter capable of implementing a rectification function.

Further, circuits 117 and 617 described in relation with FIGS. 2 and 4 may be used in other electrical energy conversion devices than those described in the present application. As an example, circuits 117 and 617 may be used to detect a voltage threshold in an electrical energy conversion device of the type described in above-mentioned patent application 2873242, or in above-mentioned article "Power Conversion and Integrated Circuit Architecture for High Voltage Piezoelectric Energy Harvesting".

Further, although circuits 117 and 617 are particularly advantageous for a use in devices for converting electrical energy originating from fluctuating or intermittent sources such as ambient energy harvesting devices, circuits 117 and 617 may also be used in other electrical energy conversion devices and, more generally, in any device requiring a circuit capable of monitoring a voltage and of switching a node between a first and a second state when the voltage to be monitored exceeds a threshold.

The invention claimed is:

1. A circuit for comparing a voltage with a first threshold, comprising:
    a first inverter;
    a second inverter having an input node coupled to an output node of the first inverter and an output node coupled to an output node of the circuit;
    a first normally-on transistor coupling and input node of the first inverter to a first node of application of said voltage;
    a second normally-on transistor coupling a first power supply node of the first inverter and a first power supply node of the second inverter to the first node of application of said voltage;
    a third normally-on transistor coupling a control gate of the second normally-on transistor to the first node of application of said voltage; and
    a first resistor coupling the control gate of the second normally-on transistor to a second node of application of said voltage,
    wherein a control gate of the first normally-on transistor, a control gate of the third normally-on transistor, a second power supply node of the first inverter, and a second power supply node of the second inverter are coupled to the second node of application of said voltage,
    and wherein the first threshold depends on the turn-off threshold of the first normally-on transistor.

2. The circuit of claim 1, wherein the first, second and third normally-on transistors are depletion MOS transistors.

3. The circuit of claim 1, wherein the input node of the first inverter is coupled to an output of the circuit via a second resistor.

4. The circuit of claim 1, wherein the input nods of the first inverter is coupled to the second node of application of said voltage via a third resistor.

5. The circuit of claim 1, wherein the input node of the first inverter is coupled to the first normally-on transistor via a fourth resistor.

6. An energy conversion circuit comprising:
    a first element comprising an electrical energy converter; and
    the circuit of claim 1.

7. The circuit of claim 6, further comprising a second electrical energy storage element, capable of being powered by said first element.

8. The circuit of claim 7, further comprising a normally-on bypass switch placed between an input node and an output node of the first element.

9. The circuit of claim 8, wherein the comparison circuit is configured to control said bypass switch according to a voltage across the second element.

10. The circuit of claim 7, wherein the comparison circuit is configured to compare a voltage across the second electrical energy storage element with said threshold.

11. The circuit of claim 6, wherein the comparison circuit is configured to control a normally-off switch connected to a power supply node of a circuit for controlling said electrical energy converter.

12. The circuit of claim 1, wherein the input node of the first inverter is connected to the first normally-on transistor.

* * * * *